(12) United States Patent
Burnham et al.

(10) Patent No.: US 8,709,887 B2
(45) Date of Patent: Apr. 29, 2014

(54) METHOD FOR FABRICATING A NITRIDED SILICON-OXIDE GATE DIELECTRIC

(75) Inventors: Jay S. Burnham, Franklin, VT (US); James S. Nakos, Essex Junction, VT (US); James J. Quinlivan, Essex Junction, VT (US); Bernie Roque, Jr., Williston, VT (US); Steven M. Shank, Jericho, VT (US); Beth A. Ward, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1441 days.

(21) Appl. No.: 11/778,238

(22) Filed: Jul. 16, 2007

(65) Prior Publication Data

US 2008/0014692 A1 Jan. 17, 2008

Related U.S. Application Data

(62) Division of application No. 10/604,905, filed on Aug. 26, 2003, now Pat. No. 7,291,568.

(51) Int. Cl.
*H01L 21/336* (2006.01)

(52) U.S. Cl.
USPC ........... 438/197; 438/299; 438/758; 438/761; 257/315; 257/369; 257/410; 257/E21.703

(58) Field of Classification Search
USPC ............. 438/763, 197, 299, 758, 761, 858; 257/315, 369, 406, 410, 80, E21.703
See application file for complete search history.

(56) References Cited

U.S. PATENT DOCUMENTS

| 4,510,172 | A | 4/1985 | Ray |
| 4,621,277 | A | 11/1986 | Ito et al. |
| 5,219,773 | A | 6/1993 | Dunn |
| 5,445,999 | A | 8/1995 | Thakur et al. |
| 5,596,218 | A | 1/1997 | Soleimani et al. |
| 5,648,284 | A | 7/1997 | Kusunoki et al. |
| 5,726,087 | A | 3/1998 | Tseng et al. |
| 5,817,549 | A | 10/1998 | Yamazaki et al. |
| 5,926,730 | A | 7/1999 | Hu et al. |
| 6,027,977 | A | 2/2000 | Mogami |
| 6,114,258 | A | 9/2000 | Miner et al. |

(Continued)

FOREIGN PATENT DOCUMENTS

| EP | 0886308 A2 | 12/1998 |
| EP | 0973189 | 1/2000 |
| JP | 2001-044419 A | 2/2001 |
| WO | WO02058130 A1 | 7/2002 |

OTHER PUBLICATIONS

Merz et al.; IBM Technical Disclosure Bulletin, vol. 28, No. 6, Nov. 1985; Controlled Nitridation of SiO2 for the Formation of Gate Insulators in FET Devices; pp. 2665-2666.

(Continued)

*Primary Examiner* — Mark A Laurenzi
(74) *Attorney, Agent, or Firm* — Schmeiser, Olsen & Watts; David Cain

(57) ABSTRACT

A method of fabricating a gate dielectric layer. The method includes: providing a substrate; forming a silicon dioxide layer on a top surface of the substrate; performing a plasma nitridation in a reducing atmosphere to convert the silicon dioxide layer into a silicon oxynitride layer. The dielectric layer so formed may be used in the fabrication of MOSFETs.

18 Claims, 7 Drawing Sheets

(56) References Cited

U.S. PATENT DOCUMENTS

| | | | |
|---|---|---|---|
| 6,136,654 | A | 10/2000 | Kraft et al. |
| 6,140,024 | A | 10/2000 | Misium et al. |
| 6,171,911 | B1 | 1/2001 | Yu |
| 6,200,651 | B1 | 3/2001 | Roche et al. |
| 6,228,779 | B1 * | 5/2001 | Bloom et al. .............. 438/763 |
| 6,254,676 | B1 * | 7/2001 | Yang et al. .................. 117/95 |
| 6,291,867 | B1 | 9/2001 | Wallace et al. |
| 6,335,252 | B1 | 1/2002 | Oishi et al. |
| 6,368,923 | B1 | 4/2002 | Huang |
| 6,380,056 | B1 | 4/2002 | Shue et al. |
| 6,380,104 | B1 | 4/2002 | Yu |
| 6,399,445 | B1 | 6/2002 | Hattangady et al. |
| 6,450,116 | B1 | 9/2002 | Noble et al. |
| 6,555,485 | B1 | 4/2003 | Liu et al. |
| 6,596,570 | B2 | 7/2003 | Furukawa |
| 6,610,615 | B1 | 8/2003 | McFadden et al. |
| 6,667,251 | B2 | 12/2003 | McFadden et al. |
| 6,723,663 | B1 | 4/2004 | Wieczorek et al. |
| 6,821,833 | B1 | 11/2004 | Chou et al. |
| 6,821,868 | B2 | 11/2004 | Cheng et al. |
| 6,906,398 | B2 | 6/2005 | Yeo et al. |
| 2001/0044186 | A1 * | 11/2001 | Reinberg .................. 438/264 |
| 2002/0023900 | A1 | 2/2002 | Mahawili |
| 2002/0072177 | A1 | 6/2002 | Grider |
| 2002/0073925 | A1 * | 6/2002 | Noble et al. ........... 118/723 ME |
| 2002/0109199 | A1 | 8/2002 | Moore |
| 2002/0130377 | A1 | 9/2002 | Khare et al. |
| 2002/0155702 | A1 * | 10/2002 | Aoki et al. .................. 438/653 |
| 2004/0142577 | A1 | 7/2004 | Sugawara et al. |
| 2005/0233599 | A1 | 10/2005 | Sugawara et al. |
| 2006/0246436 | A1 | 11/2006 | Ohno et al. |

OTHER PUBLICATIONS

Haggett et al.; IBM Technical Disclosure Bulletin, vol. 19, No. 4, Sep. 1976; MNOS Reactor Process; p. 1160.

Dockerty et al.; IBM Technical Disclosure Bulletin, vol. 14, No. 4, Sep. 1971; Transconductance in Silicon Gate Nitride-Oxide IGFET; p. 1098.

Supplementary European Search Report; Jul. 4, 2008.

European Patent Office—Office Action dated Jun. 16, 2009; Application No. 04 782 258.-1235. 3 pages.

* cited by examiner ns and element sizes are shrinking and gate dielectrics must scale accordingly. As physical gate dielectric thickness has decreased, the need for a higher dielectric constant and less leaky gate dielectric has arisen. In advanced metal oxide semiconductor field effect transistors (MOSFETs) silicon oxynitride ($SiO_xN_y$) layers are used as a gate dielectric. MOSFET transistors include a channel region formed in a silicon substrate, an N or P doped polysilicon gate formed on top of a thin gate dielectric layer and aligned over the channel region, and source/drain regions formed in the silicon substrate on either side of the channel region.

However, a problem with $SiO_xN_y$ gate dielectrics is thickness and nitrogen concentration variation across the wafer. Across wafer thickness and nitrogen concentration variation of the gate dielectric leads directly to across wafer threshold voltage variation, especially in P-channel field effect transistors (PFETs), causing variations in performance of individual integrated circuit chips from the same wafer. Therefore, there is a need for a method of fabricating a $SiO_xN_y$ layer having a relatively uniform across wafer thickness and nitrogen concentration.

SUMMARY OF THE INVENTION

A first aspect of the present invention is a method of fabricating a gate dielectric layer, comprising: providing a substrate; forming a silicon dioxide layer on a top surface of the substrate; performing a plasma nitridation in a reducing atmosphere to convert the silicon dioxide layer into a silicon oxynitride layer.

A second aspect of the present invention is a method of fabricating a MOSFET, comprising: providing a semiconductor substrate having at least a uppermost silicon layer; forming a silicon dioxide layer on a top surface of the semiconductor substrate; performing a plasma nitridation in a reducing atmosphere to convert the silicon dioxide layer into a silicon oxynitride layer; forming a polysilicon gate on the silicon oxynitride layer aligned over a channel region in the semiconductor substrate; and forming source/drain regions in the semiconductor substrate, the source drain regions aligned to the polysilicon gate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term nitrided silicon dioxide refers to a $SiO_2$ layer into which nitrogen has been introduced to form a silicon oxynitride ($SiO_xN_y$). The scope of $SiO_xN_y$ includes all combinations of integers x and y (or fractions thereof) at which $SiO_xN_y$ is stable. A reducing atmosphere is defined as a gaseous atmosphere containing species that react with oxygen.

Figure 1:
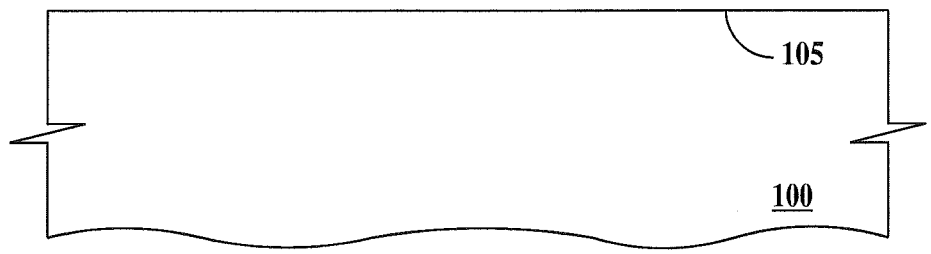
FIGS. 1 through 3 are partial cross-sectional views illustrating fabrication of a nitrided gate dielectric layer according to the present invention.
Figure 2:
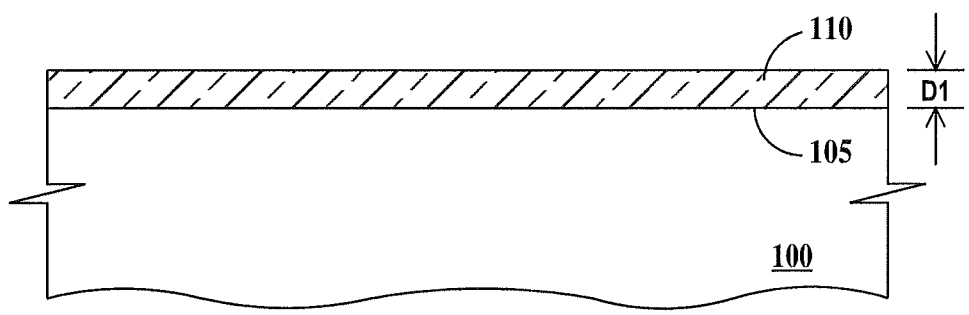
Figure 3:
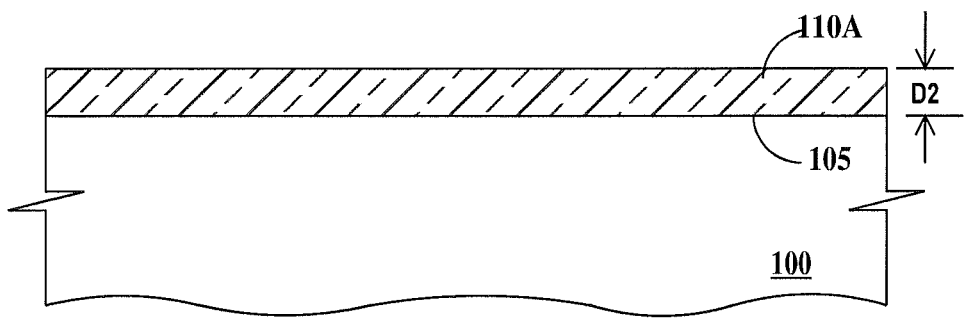

FIGS. 1 through 3 are partial cross-sectional views illustrating fabrication of a nitrided gate dielectric layer according to the present invention. In FIG. 1 a substrate 100 having a top surface 105 is provided. Substrate 100 may be an intrinsic, N-type or P-type bulk silicon substrate, an undoped or an intrinsic, N-type or P-type silicon on insulator (SOI) substrate or a sapphire substrate or a ruby substrate.

In FIG. 2, a base $SiO_2$ layer 110 having a thickness D1 is formed on top surface 105 of substrate 100. Prior to formation of base $SiO_2$ layer 110 on surface 105, the surface is cleaned by any one of a number of cleaning processes well known in the art. For example, surface 105 may be cleaned using a buffered hydrofluoric acid (BHF) clean followed by an $NH_4OH$ clean followed by an HCl clean. If substrate 100 is a bulk silicon substrate or an SOI substrate, base $SiO_2$ layer 110 may be formed, in a first example, by a thermal oxidation in a furnace in an oxygen-containing atmosphere at about 600 to 800° C. for about 0.5 to 30 minutes. In a second example, base $SiO_2$ layer 110 may be formed by a rapid thermal oxidation (RTO) in an oxygen-containing atmosphere at about 800 to 1000° C. for about 5 to 60 seconds. If substrate 100 is a ruby or sapphire substrate, base $SiO_2$ layer 110 may be formed by a deposition in a chemical vapor deposition (CVD) tool and dielectric layer may be a tetraethoxysilane (TEOS) oxide. TEOS may also be used for a bulk silicon or SOI substrate. TEOS may also be used for bulk silicon or SOI substrates. In one example, D1 is about 8 to 23 Å thick. For any substrate, base $SiO_2$ layer 110 may be a native oxide allowed to form by exposure of a cleaned silicon surface to air or oxygen or base $SiO_2$ layer 110 may be formed by an oxidizing cleaning process of a "bare" silicon surface.

In FIG. 3, a remote plasma nitridation (RPN) process is performed to convert base $SiO_2$ layer 110 (see FIG. 2) to a nitrided $SiO_2$ ($SiO_xN_y$) layer 110A. The remote plasma nitridation process is described below in reference to FIGS. 6, 7 and 9. $SiO_xN_y$ layer 110A has a thickness D2. In one example, D2 is about 8 to 24 Å thick. In one example, $SiO_xN_y$ layer 110A about 2 to 20% nitrogen atoms. In a second example, the concentration of nitrogen in $SiO_xN_y$ layer 110A is between 1E21 and 1E22 atm/cm$^3$. An advantage of the present invention is that there is little increase in dielectric thickness of the after nitridation oxide compared to thickness of the oxide before nitridation. While the amount of thickness increase is a function of the before nitridation oxide thickness (D1), the after nitridation oxide thickness (D2) is generally only increased about 0 to 5%.

Figure 4:
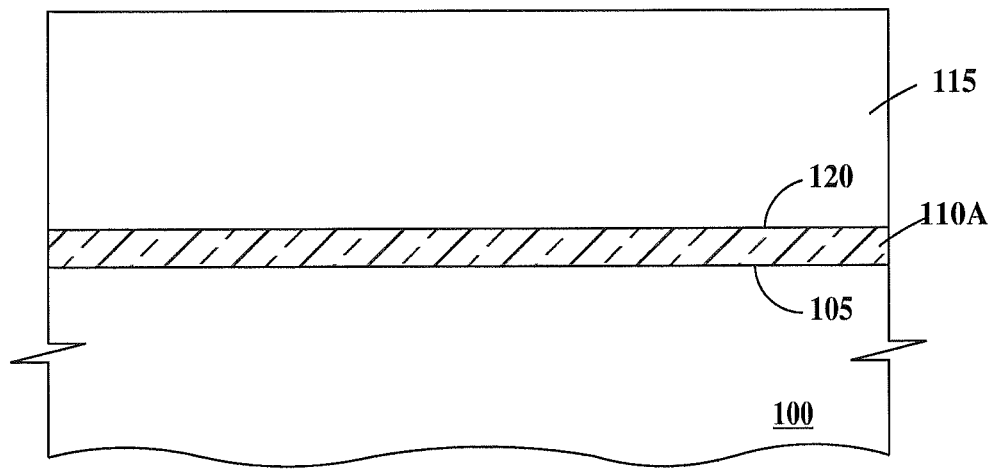
FIGS. 4 and 5 are partial cross-sectional views illustrating fabrication of a MOSFET according to the present invention.
Figure 5:
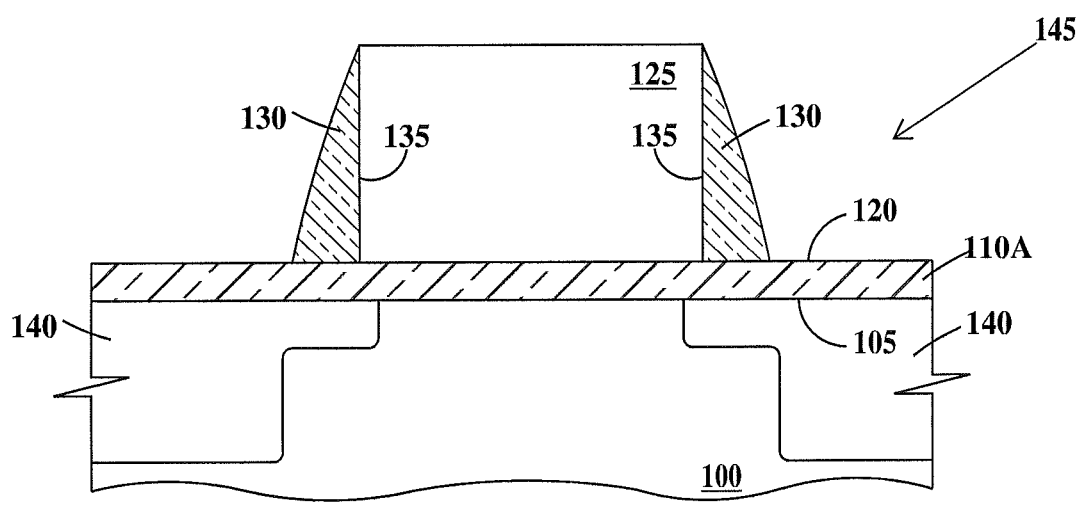

FIGS. 4 and 5 are partial cross-sectional views illustrating fabrication of a MOSFET according to the present invention. FIG. 4 continues from FIG. 3. In FIG. 4, a polysilicon layer 115 is formed on a top surface 120 of $SiO_xN_y$ layer 110A. Polysilicon layer 115 may be formed using one of a number of deposition processes well known in the art, such as low-pressure chemical vapor deposition (LPCVD) or rapid thermal chemical vapor deposition (RTCVD). Polysilicon layer 115 may be undoped or doped N-type or P-type. In one example, polysilicon layer 115 is 1000 to 2000 Å thick.

In FIG. 5, polysilicon layer 115 (see FIG. 4) is etched; for example, by a reactive ion etch (RIE) processes to form a gate 125. Spacers 130 are formed on sidewalls 135 of gate 125. Formation of source/drains 140 (typically by one or more ion-implantation processes) essentially completes fabrication of MOSFET 145, $SiO_xN_y$ layer 110A being the gate dielectric of the MOSFET. If polysilicon layer 115 (see FIG. 4) was not doped during deposition, gate 125 may be doped N-type or P-type after spacer formation by ion implantation in conjunction with the formation of source/drains 140 or as a separate step.

Figure 6:
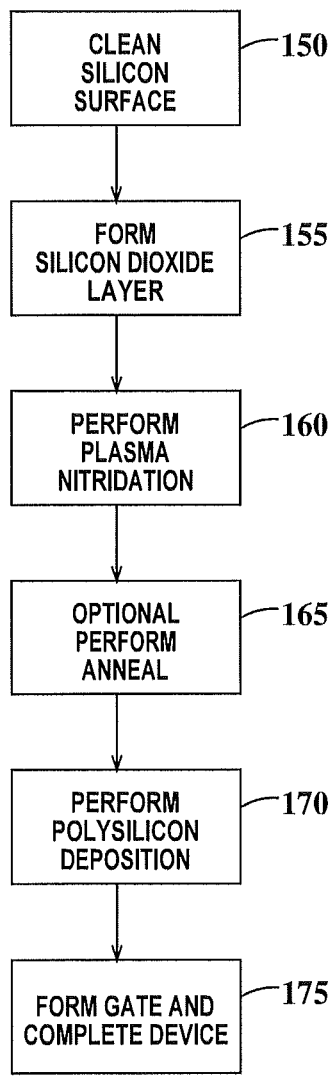
FIG. 6 is a flowchart of the process steps for fabricating a dielectric layer and the MOSFET illustrated in FIGS. 1 through 4 according to the present invention.

FIG. 6 is a flowchart of the process steps for fabricating a dielectric layer and the MOSFET illustrated in FIGS. 1 through 5 according to the present invention. A silicon substrate will be used as an example. In step 150, the surface of the silicon substrate is cleaned by any one of a number of cleaning processes well known in the art. In a first example, silicon surface 105 may be cleaned using a buffered hydrofluoric acid (BHF) clean followed by an $NH_4OH$ clean followed by an HCl clean. Alternatively, in a second example, the silicon surface may be cleaned using BHF followed by an $O_3$ clean, followed by a dry HCl clean.

In step 155, a base $SiO_2$ layer is formed, for example, by a thermal oxidation in a furnace in an oxygen-containing atmosphere at about 600 to 800° C. for about 0.5 to 30 minutes, by a RTO in an oxygen-containing atmosphere at about 800 to 1000° C. for about 5 to 60 seconds or by exposing a cleaned silicon surface to air or oxygen. The base $SiO_2$ layer is about 8 to 23 Å thick.

In step 160 a remote plasma nitridation process is performed. In a first example, a mixture of nitrogen and an inert gas such as helium are introduced into the plasma generation port of the remote plasma nitridation tool and a reducing gas such as hydrogen or ammonia is introduced through a second, non plasma generation port while the wafer being processed is rotated in the process chamber (see FIG. 7). Typical process conditions are nitrogen flow rate of about 1 to 20 slm (standard liters/minute), helium (or other inert gas) flow rate of about 1 to 20 slm, hydrogen (ammonia or other reducing gas) flow rate of about 1 to 20 slm, a chamber pressure of about 0.2 to 50 Torr, microwave power of 1000 to 3000 watts and a wafer temperature of about 25 to 1000° C. for about 20 to 500 seconds.

Figure 10:
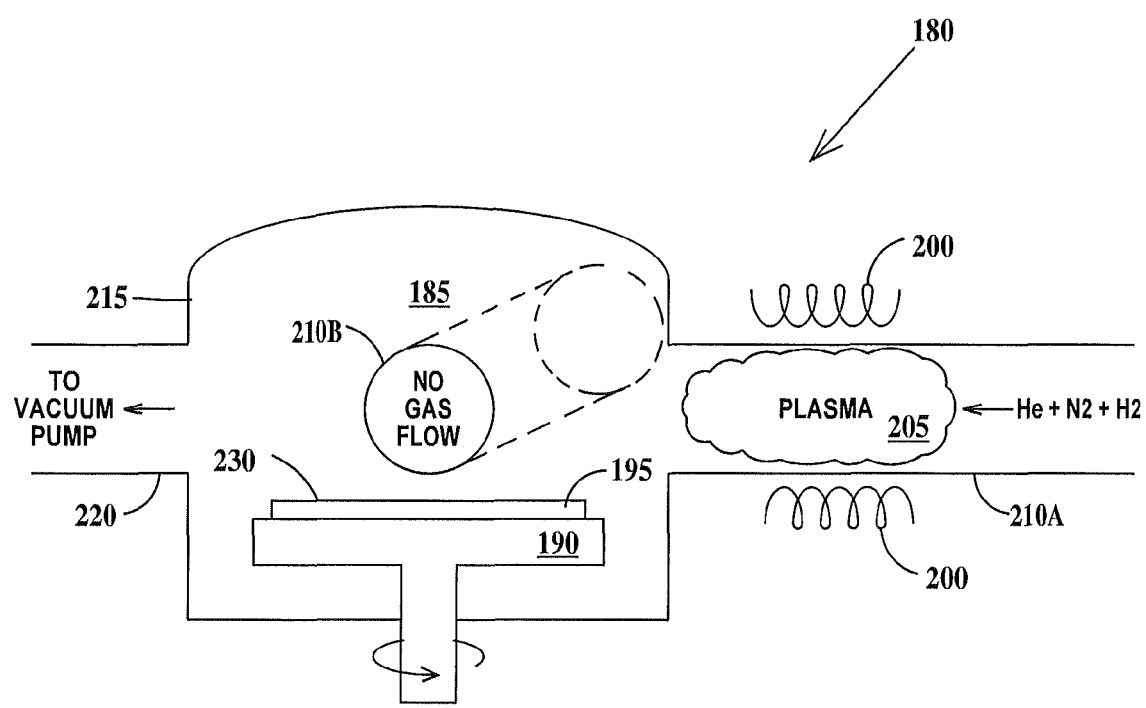
FIG. 10 is schematic illustration of a remote plasma system nitridation system for performing a nitridation step according to a second embodiment the present invention.

In a second example, a mixture of nitrogen, an inert gas such as helium and a reducing gas such as hydrogen or ammonia are introduced into the plasma generation port of the remote plasma nitridation tool while the wafer being processed is rotated in the process chamber (see FIG. 10). Typical process conditions are nitrogen flow rate of about 1 to 20 slm, helium (or other inert gas) flow rate of about 1 to 20 slm, hydrogen flow rate of about 1 to 20 slm, a chamber pressure of about 0.2 to 50 Torr, microwave power of 1000 to 3000 watts and a wafer temperature of about 25 to 1000° C. for about 20 to 500 seconds.

In both examples, the nitrogen dose is about 1E14 to 5E15 atom/cm2 and the completed $SiO_xN_y$ layer contains about 2 to 20% nitrogen.

In step 165, an optional anneal step is performed. Generally annealing is not required since the remote plasma nitridation is done on hot wafers. Either a standard rapid thermal anneal (RTA) or a spike RTA may be performed. A spike anneal is used to increase the mobility without driving the nitrogen to the $SiO_2$/Si interface. A spike anneal is defined as an anneal where the time the wafer is at a maximum wafer temperature is about 60 seconds or less while a standard RTA is defined as an anneal where the time the wafer is at a maximum wafer temperature is greater than about 60 seconds.

The following steps use the nitrided $SiO_2$ dielectric as a gate dielectric for a MOSFET.

In step 170, a polysilicon layer is formed over the nitrided $SiO_2$ using one of a number of deposition processes well known in the art, such as LPCVD or RTCVD. The polysilicon layer may be undoped or doped N-type of P-type. In one example, the polysilicon layer is 1000 to 2000 Å thick.

In step 175, the MOSFET is essentially completed. The polysilicon layer is etched; for example, by a RIE processes to form a gate, spacers are formed on sidewalls of the gate and source/drains are formed in the substrate on either side of the gate (typically by one or more ion-implantation processes). The $SiO_xN_y$ layer is the gate dielectric of the MOSFET. If the polysilicon layer was not doped during deposition, the gate may be doped N-type or P-type after spacer formation by ion implantation in conjunction with the formation of the source/drains or as a separate step.

Figure 7:
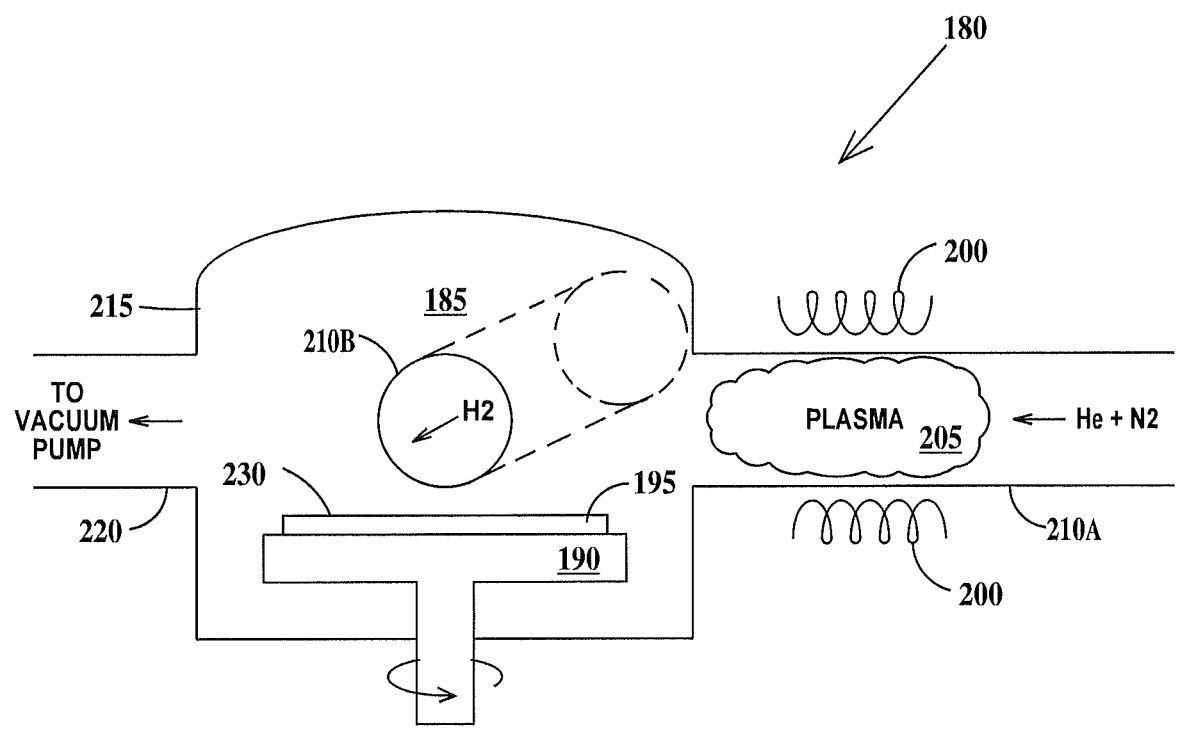
FIG. 7 is a schematic illustration of a remote plasma system nitridation system for performing a nitridation step according to a first embodiment the present invention.

FIG. 7 is a schematic illustration of a remote plasma system nitridation system for performing a nitridation step according to a first embodiment the present invention. In FIG. 7, remote plasma tool 180 includes a chamber 185 and a rotatable wafer chuck 190 (for holding a wafer 195) within the chamber. Microwave coils 200 for supplying energy to initiate and sustain a plasma 205 surround a first inlet port 210A in sidewall 215 of chamber 185. Gases (in the present example a helium/nitrogen mixture) for generating plasma 205 are supplied through port 210A. A reducing gas (in the present example, hydrogen) is supplied through a second inlet port 210B. Other reducing gases include ammonia, a mixture of hydrogen and nitrogen, a mixture of ammonia and nitrogen and a mixture of hydrogen, ammonia and nitrogen, deuterium, deuterated ammonia, a mixture of deuterium and nitrogen, a mixture of deuterated ammonia and nitrogen, a mixture of deuterium, deuterated ammonia and nitrogen, and a mixture of deuterium, ammonia and nitrogen. An exhaust port 220 connected to a vacuum pump (not shown), also in sidewall 215 of chamber 185 removes spent species and maintains processing pressure. Exhaust port 220 and first inlet port 210A are positioned on diametrically opposite sides of chamber 185 and second inlet port 210B is positioned between the first inlet port and the exhaust port.

In use, wafer 195 having a base $SiO_2$ layer (not shown) on a top surface 230 of the wafer is placed into chamber 185 from a transfer chamber (not shown) and rotated, a pre-selected nitridation gas mixture (in the present example, He/$N_2$) at a pre-selected flow rate is introduced into the chamber via first inlet 210A, a pre-selected reducing gas mixture (in the present example, $H_2$ or $NH_3$) at a pre-selected flow rate is introduced into the chamber via second inlet B and the chamber maintained at a pre-selected pressure via the vacuum pump attached to exhaust port 220. A pre-selected wattage of microwave power is impressed on microwave coils 200 to energize and maintain plasma 205. After a pre-selected time, the microwave power is turned off extinguishing plasma 205, the gas flows are turned off and chamber 185 is brought up to transfer chamber pressure. Plasma 205 is predominantly a nitrogen ion, helium ion, hydrogen neutral plasma.

One example of a suitable tool for practicing the present invention is an AMAT model XE12 chamber manufactured by Applied Materials Corp, Santa Clara, Calif. with a decoupled plasma unit also supplied by Applied Materials Corp.

Figure 8:
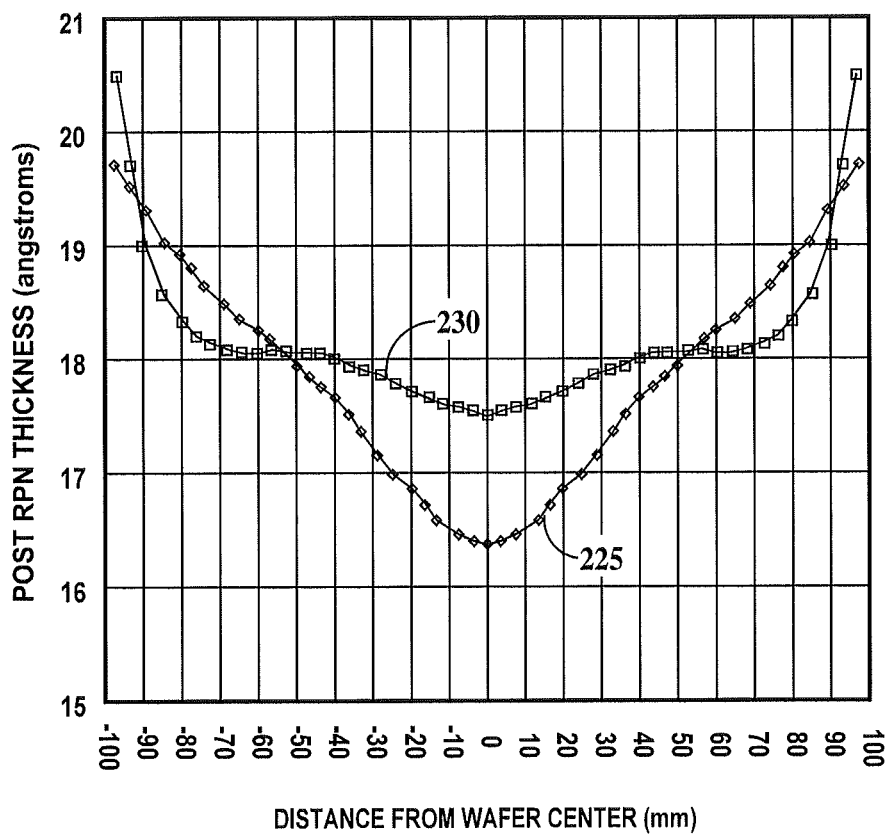
FIG. 8 is a chart illustrating the improvement in across wafer thickness control of nitrided silicon-oxide gate dielectrics according to the present invention.

FIG. 8 is a chart illustrating the improvement in across wafer thickness control of nitrided silicon-oxide gate dielectrics according to the present invention. FIG. 8 plots the thickness of a post RPN silicon oxide film as a function of distance from the center of a wafer for two nitrided silicon dioxide films of equal mean thickness. Measurements were performed using an ellipsometer. Curve 225 is a $SiO_xN_y$ layer processed as described supra, but without any reducing gas flow. The mean thickness of the $SiO_xN_y$ layer of curve 225 is 17.9 Å with a sigma of 0.97. Curve 230 is a $SiO_xN_y$ layer processed as described supra, but with a reducing gas flow. The mean thickness of the $SiO_xN_y$ layer of curve 230 is 18.0 Å with a sigma of 0.50. Thus, introduction of a reducing species results in about a twofold increase in thickness uniformity.

Secondary ion mass spectrometry (SIMS) profiles of the layer 225 and 230 indicate improvements in nitrogen concentration uniformity tracks very well with improvement in $SiO_xN_y$ thickness, uniformity as seen by TABLE I. Note there is a one to one correspondence between nitrogen dose and concentration.

TABLE I

| WAFER | PROCESS | Nitrogen Dose Wafer Center | Nitrogen Dose Wafer Edge | Delta |
|---|---|---|---|---|
| Wafer A | RPN w/o $H_2$ | 4.8E14 atm/cm$^2$ | 7.3E14 atm/cm$^2$ | 52% |
| Wafer B | RPN w $H_2$ | 2.0E14 atm/cm$^2$ | 2.5E14 atm/cm$^2$ | 25% |
| Wafer C | RPN w $H_2$ | 4.3E14 atm/cm$^2$ | 5.2E14 atm/cm$^2$ | 21% |

In table I, nitrogen concentration varies by over 50% from center to edge in a wafer processed by remote plasma nitridation without a reducing gas present in the chamber. In two examples of a wafer processed by remote plasma nitridation with a reducing gas present in the chamber nitrogen concentration varies by not more than 25% from center to edge in a wafer.

Thus, both the $SiO_xN_y$ thickness uniformity and nitrogen concentration uniformity improve by factors of about two.

Figure 9:
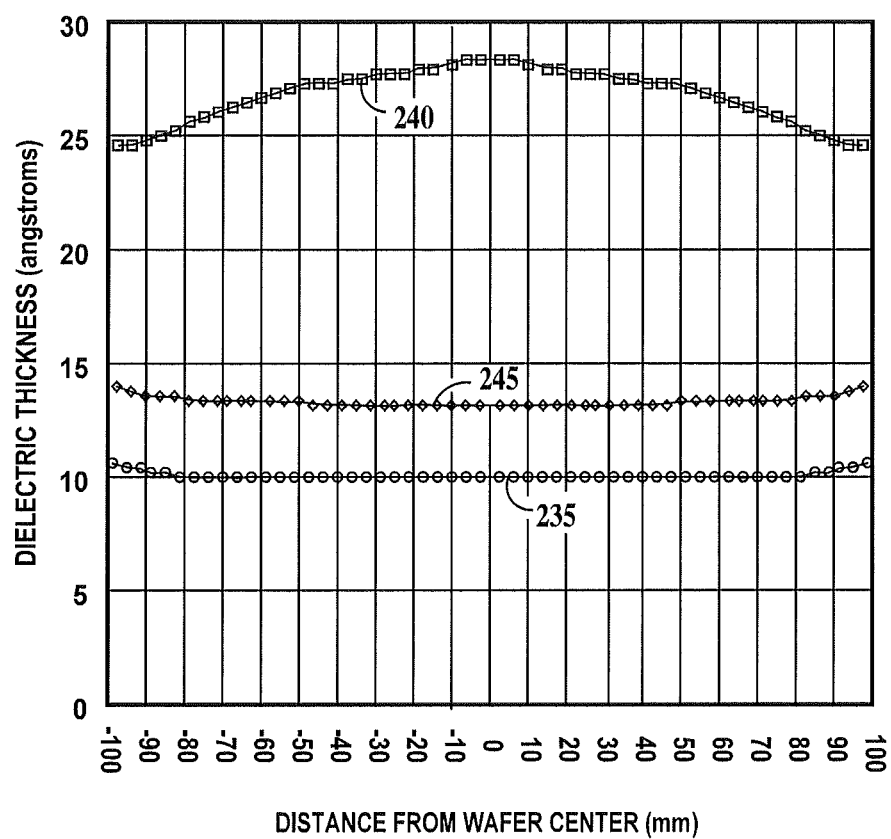
FIG. 9 is a chart illustrating the difference in thickness of nitrided silicon dioxide without and without use of a reducing gas according to the present invention.

FIG. 9 is a chart illustrating the difference in thickness of nitrided silicon dioxide without use of a reducing gas according to the present invention. Another problem of an RPN process performed without the use of a reducing gas as described supra, is an unacceptable increase in dielectric thickness as expressed as the difference between the base $SiO_2$ layer and the finished $SiO_xN_y$ layer. Introduction of a reducing gas into the RPN chamber greatly reduces this thickness increase as FIG. 9 shows. FIG. 9 plots the thickness of a native oxide (curve 235), a post RPN native oxide film processed without reducing gas (curve 240) and a post RPN native oxide film processed with reducing gas (curve 245) as functions of distance from the center of a wafer. Measurements were performed using an ellipsometer. Curve 240 is a $SiO_xN_y$ layer made from a native oxide layer about 10 Å thick processed as described supra, but without any reducing gas flow. The mean thickness of the $SiO_xN_y$ layer of curve 240 is about 25 to 27.5 Å. Curve 245 is a $SiO_xN_y$ layer processed as described supra, but with a reducing gas flow. The mean thickness of curve 245 is about 13 to 13.5 Å. Thus, introduction of a reducing species dramatically reduces dielectric layer thickness increase during RPN processes. Thickness increase is limited to about 35%. In some cases thickness increase can approach zero.

FIG. 10 is schematic illustration of a remote plasma system nitridation system for performing a nitridation step according to a second embodiment the present invention. FIG. 10 is similar to FIG. 7 except for the facts that no gas is supplied by second inlet port 210B and all gases (nitrogen, helium and hydrogen) are supplied through first inlet port 210A. Plasma 205 is predominantly a nitrogen ion, helium ion, hydrogen ion plasma.

Thus, the need for a method of fabricating a $SiO_xN_y$ layer having a relatively uniform across wafer thickness has been satisfied by the present invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed:

1. A method of fabricating a MOSFET, comprising:
   forming a silicon dioxide layer on a top surface of a semiconductor substrate, said semiconductor substrate having at least an uppermost silicon layer;
   after said forming said silicon dioxide layer, performing a plasma nitridation in a reducing atmosphere to convert said silicon dioxide layer into a silicon oxynitride layer;
   forming a polysilicon gate on said silicon oxynitride layer aligned over a channel region in said semiconductor substrate; and
   forming source/drain regions in said semiconductor substrate, said source drain regions aligned to said polysilicon gate.

2. The method of claim 1, wherein the step of performing a plasma nitridation is performed using a remote plasma nitridation process.

3. The method of claim 1, wherein the step of performing a plasma nitridation is performed using a nitrogen and an inert gas plasma introduced through a first inlet of a remote plasma nitridation tool and a neutral reducing gas introduced through a second inlet of said remote plasma nitridation tool.

4. The method of claim 3, wherein said neutral inert gas is helium and said reducing gas is selected from the group consisting of (i) hydrogen, (ii) ammonia, (iii) a mixture of hydrogen and nitrogen, (iv) a mixture of ammonia and nitrogen, (v) a mixture of hydrogen, ammonia and nitrogen, (vi) deuterium, (vii) deuterated ammonia, (viii) a mixture of deuterium and nitrogen, (ix) a mixture of deuterated ammonia and nitrogen, (x) a mixture of deuterium, (xi) a mixture of deuterated ammonia and nitrogen, and (xii) a mixture of deuterium, ammonia and nitrogen.

5. The method of claim 1, wherein the step of performing a plasma nitridation is performed using plasma comprising nitrogen, an inert gas and a reducing gas.

6. The method of claim 5, wherein said inert gas is helium and said reducing gas is hydrogen.

7. The method of claim 1, wherein said substrate includes a bulk silicon or silicon on insulator substrate and said forming a silicon dioxide layer is formed by a process selected from the group consisting of native oxide growth in air or oxygen, thermal oxidation, rapid thermal oxidation, chemical vapor deposition and oxidizing cleaning processes.

8. The method of claim 1, wherein said silicon dioxide layer has a thickness of about 8 to 23 Å.

9. The method of claim 1, wherein said silicon oxynitride has a thickness of about 8 to 24 Å.

10. The method of claim 1, wherein said silicon oxynitride film contains between about 2 and 20 percent nitrogen.

11. The method of claim 1, wherein the concentration of nitrogen in said silicon oxynitride layer is between about 1E21 and 1E22 atm/cm$^3$.

12. The method of claim 1, wherein the step of performing a plasma nitridation imparts a dose of nitrogen in between about 1E14 and 5E14 atm/cm$^2$ to said silicon dioxide layer.

13. The method of claim 1, wherein said silicon oxynitride layer has a thickness of about 0 to 35% greater than the thickness of said silicon dioxide layer.

14. The method of claim 1, wherein the mean thickness of said silicon oxynitride layer varies by no more than about one-half angstrom sigma from a center to an edge of said substrate.

15. The method of claim 1, wherein the nitrogen concentration of said silicon oxynitride layer varies by not more than about 25% from a center to an edge of said substrate.

16. The method of claim 1, further including:
   after said forming said polysilicon gate and before said forming said source/drain regions, forming dielectric sidewall spacers on sidewalls of said gate.

17. The method of claim 3, wherein said neutral inert gas is helium and said reducing gas is selected from the group consisting of (i) hydrogen, (ii) ammonia, (iii) a mixture of hydrogen and nitrogen, (iv) a mixture of ammonia and nitrogen, and (v) a mixture of hydrogen, ammonia and nitrogen.

18. The method of claim 3, wherein said neutral inert gas is helium and said reducing gas is selected from the group consisting of (i) deuterium, (ii) deuterated ammonia, (iii) a mixture of deuterium and nitrogen, (iv) a mixture of deuterated ammonia and nitrogen, (v) a mixture of deuterium, (vi) a mixture of deuterated ammonia and nitrogen, and (vii) a mixture of deuterium, ammonia and nitrogen.

\* \* \* \* \*